United States Patent
Verkuil

[19]

[11] Patent Number: 5,834,941
[45] Date of Patent: Nov. 10, 1998

[54] MOBILE CHARGE MEASUREMENT USING CORONA CHARGE AND ULTRAVIOLET LIGHT

[75] Inventor: Roger L. Verkuil, Wappinger Falls, N.Y.

[73] Assignee: Keithley Instruments, Inc., Cleveland, Ohio

[21] Appl. No.: 909,176

[22] Filed: Aug. 11, 1997

[51] Int. Cl.⁶ .......................... G01N 27/60; G01R 31/26; G01R 31/308
[52] U.S. Cl. .......................... 324/455; 324/452; 324/753; 324/766
[58] Field of Search .................. 324/452, 455, 324/457, 72, 109, 501, 750, 753, 766

[56] References Cited

U.S. PATENT DOCUMENTS

| | | | |
|---|---|---|---|
| 3,449,658 | 6/1969 | Robinson et al. | 324/455 |
| 4,812,756 | 3/1989 | Curtis et al. | 324/750 |
| 5,216,362 | 6/1993 | Verkuil | 324/767 |
| 5,498,974 | 3/1996 | Verkuil et al. | 324/767 |
| 5,661,408 | 8/1997 | Kamieniecki et al. | 324/765 |

*Primary Examiner*—Glenn W. Brown
*Attorney, Agent, or Firm*—Pearne, Gordon, McCoy & Granger LLP

[57] ABSTRACT

Corona charge is applied to an oxide layer on a semiconductor wafer. Then ultraviolet light is used to erase a grid pattern of the corona charge. Opposite polarity corona charge is then applied to the layer, resulting in a grid of field-induced PN junctions. The surface photovoltage of the junctions is measured over time to provide a measure of the mobile charge in the oxide layer.

7 Claims, 4 Drawing Sheets

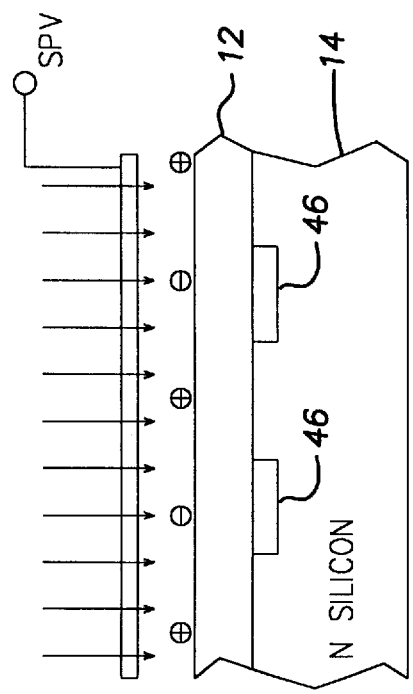
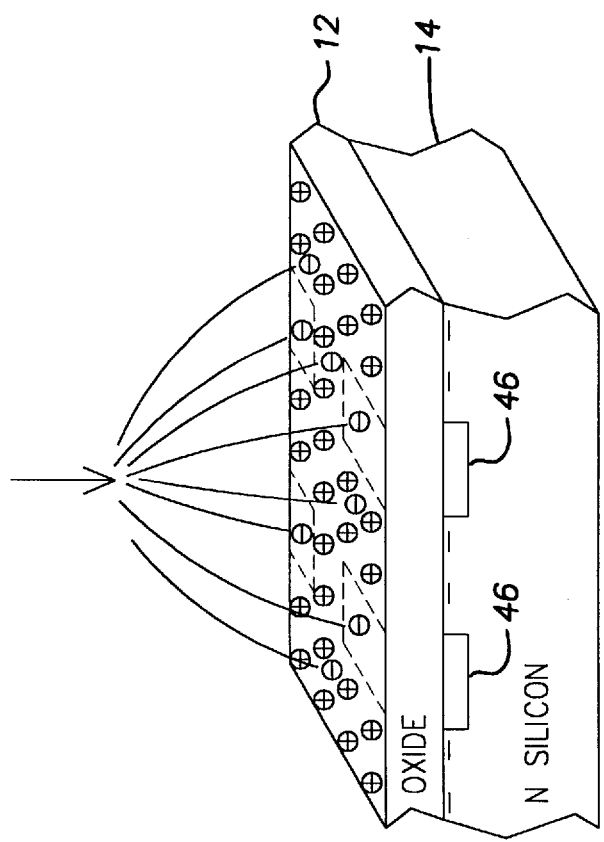
FIG. 7
FIG. 6

5,834,941

MOBILE CHARGE MEASUREMENT USING CORONA CHARGE AND ULTRAVIOLET LIGHT

BACKGROUND OF THE INVENTION

The present invention relates to the measurement of semiconductor characteristics and, in particular, to the contactless measurement of mobile charge in insulator layers.

Measurement of mobile charges in dielectric layers on semiconductor wafers have been made, for example, using metal electrodes specially deposited for that purpose. Typically, the dielectric of interest is an oxide insulator layer. These methods usually involve some means of making the mobile charges move up and/or down in the layer.

More recently, methods using corona charge have been used that eliminate the need for depositing electrodes, or even contacting the surface. U.S. Pat. No. 5,498,974 shows the measurement of mobile charge using corona charge and is incorporated herein by reference.

Unfortunately, the insulator layers in semiconductor fabrication are becoming thinner. This makes it more difficult to accurately measure mobile charge based on up and down movement of charges in the insulator, no matter what method is used to move the charges.

As oxide layers get thinner, new methods of mobile charge measurement are needed to accurately monitor the characteristics and quality of the semiconductor fabrication process.

SUMMARY OF THE INVENTION

A method for measuring mobile charge in a dielectric layer on a semiconductor substrate includes applying a first polarity corona charge to the layer, illuminating the layer in a grid-like pattern with light, applying a second polarity corona charge to the layer, and measuring a surface photovoltage characteristic for the layer. The surface photovoltage characteristic is indicative of the mobile charge.

BRIEF DESCRIPTION OF THE DRAWINGS

FIG. 6 is an enlarged perspective view of a portion of a semiconductor substrate and dielectric layer during one step of the invention.

FIG. 7 is an enlarged cross section view of a portion of a semiconductor substrate and dielectric layer during one step of the invention.

DESCRIPTION OF THE PREFERRED EMBODIMENTS

Figure 1:
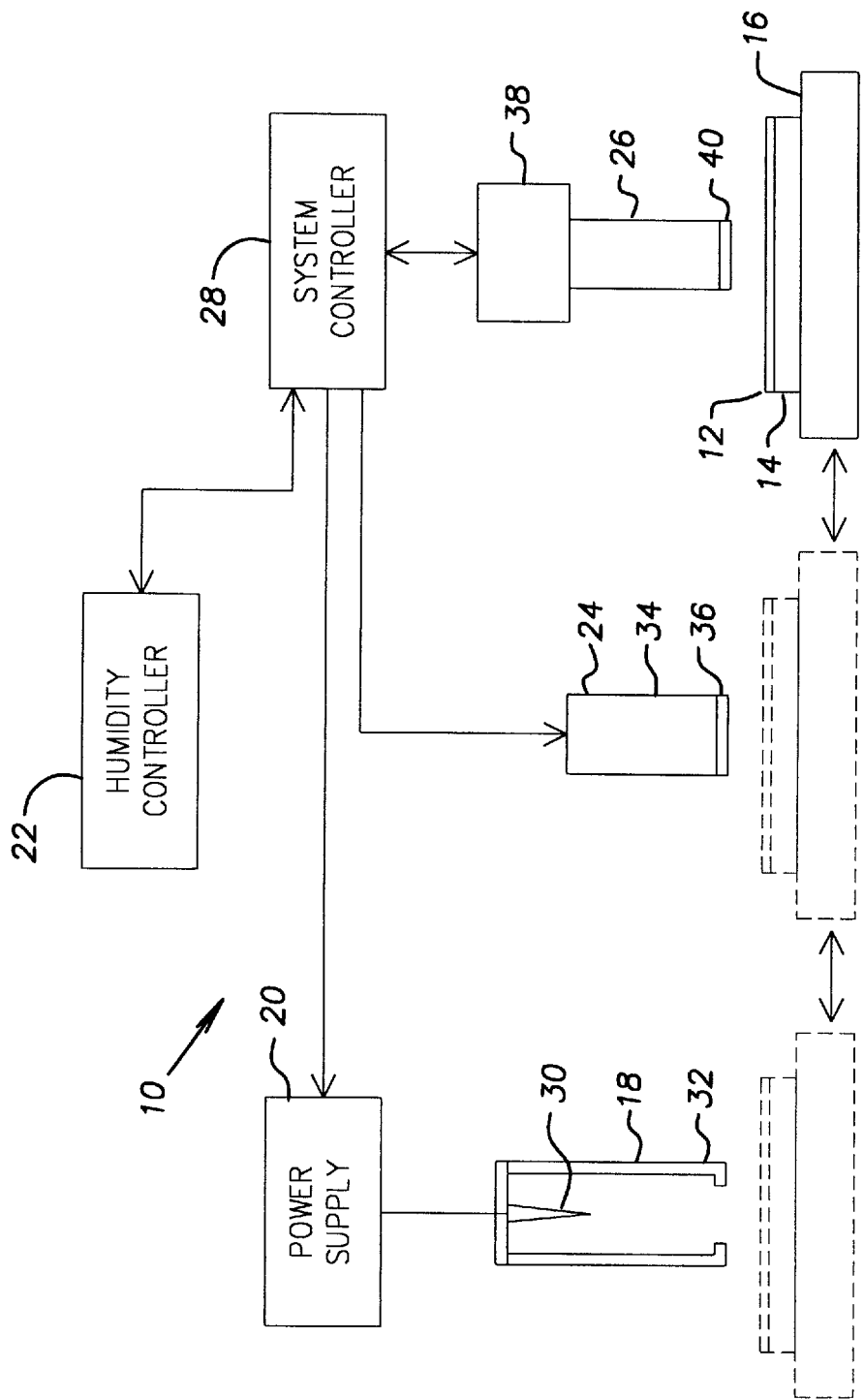
FIG. 1 is combination block and schematic diagram of an apparatus suitable for performing the method of the invention.

Referring to FIG. 1, an apparatus 10 for measuring mobile charge in a dielectric layer 12 on a semiconductor substrate 14 includes a vacuum chuck 16, corona gun 18, a corona power supply 20, a humidity controller 22, a test pattern source 24, a surface photovoltage (SPV) tool 26 and a system controller 28. The semiconductor substrate 14 may be, for example, a semiconductor wafer of silicon (with doping) and the dielectric layer 12 may be, for example, an insulator layer, such as an oxide of the substrate 14.

The chuck 16 (and the substrate 14 and the layer 12) is moveable to positions under the corona gun 18, the test pattern source 24 and the SPV tool 26 by a translation stage (not shown) that is controlled by the controller 28. As alternatives, the corona gun 18, the pattern source 24 and the SPV tool 26 can be translated with respect to a stationary chuck.

The corona gun 18 includes a corona emitter 30 (e.g., tungsten carbide needle) connected to the corona power supply 20 (e.g., ±8,000 volts). A conductive cylindrical enclosure 32 about the emitter 30 helps to produce a uniform flow of corona charge from the corona gun 18. The opening in the enclosure 32 is, for example, 9 mm in diameter. Depending on the polarity of the power supply 20, a positive or negative corona charge will be deposited on the portion of the layer 12 located beneath the corona gun 18. The corona gun 18 may be, for example, located 5 to 10 mils above the layer 12. The operation of the corona gun 18 and the power supply 20 is controlled by the controller 28.

Figure 3:
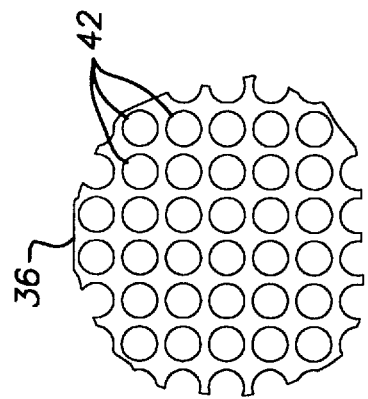
FIG. 3 is plan view of a portion of a grating used in the apparatus of FIG. 1.

The pattern source 24 includes a light source 34 and a grating 36. The light source 34 may be, for example, an ultraviolet discharge lamp. The light source 34 illuminates the grating 36 to provide a grid-like pattern of darkness and light on the portion of the layer 12 located beneath the pattern source 24. The grating 36 may be, for example, a metal sheet with an array of holes 42 such as shown in FIG. 3. While round holes are easiest to obtain, other shapes (e.g., squares) are possible. As an alternative, the grating can be a mesh formed of crisscrossed opaque elements. The grating 36 may be, for example 120 mils in diameter and have holes 42 on 16 mil centers. The pattern source 24 may be, for example, located 5 to 10 mils above the layer 12. The operation of the pattern source is controlled by the controller 28.

The SPV tool 26 measures the voltage difference between the surface of the layer 12 and the chuck 16. The SPV tool includes a varying intensity light source 38 that is directable onto the layer 12 through a transparent electrode 40 located within a few mils of the layer 12. Any surface voltage produced by the varying light source 38 is capacitively sensed by the electrode 40. The varying (e.g., 40 Hz) light source 38 may be, for example, a red LED and the electrode 40 may be, for example, 6 mm in diameter. The SPV tool 26 is controlled by the controller 28 and provides SPV measurements to the controller 28.

The humidity controller 22 controls the relative humidity about the surface of the layer 12. The humidity controller 22 will typically include a relative humidity sensor and some means of changing the humidity in the testing environment. For example, zero relative humidity nitrogen from a compressed source can be used to lower the humidity and the same nitrogen can be bubbled through deionized water to increase the humidity. The humidity controller 22 is controlled by the controller 28.

The controller 28 may include, for example, a general purpose computer programmed to control the apparatus 10 and to perform measurements according to the invention.

Figure 2:
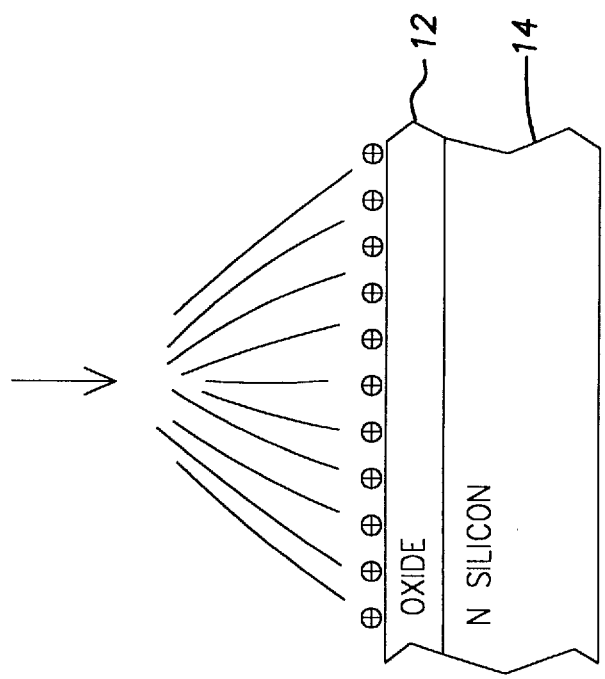
FIG. 2 is an enlarged cross section view of a portion of a semiconductor substrate and dielectric layer during one step of the invention.
Figure 5:
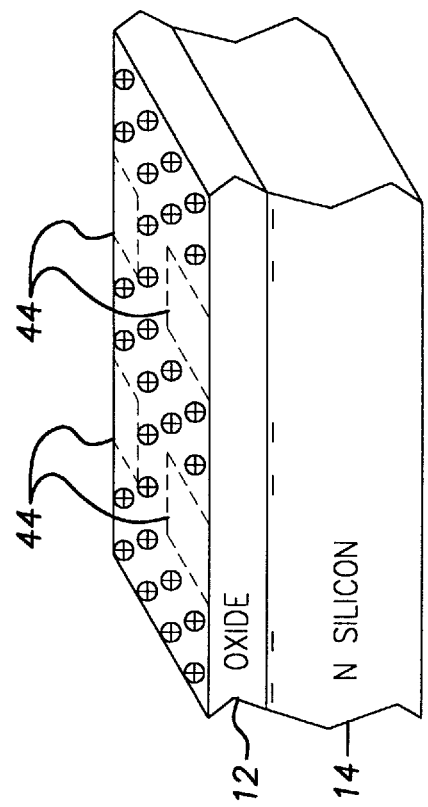
FIG. 5 is an enlarged perspective view of a portion of a semiconductor substrate and dielectric layer after the step of FIG. 4.
Figure 4:
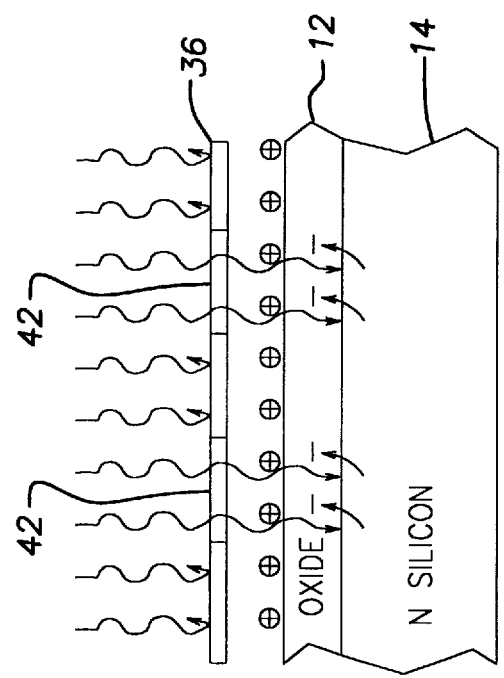
FIG. 4 is an enlarged cross section view of a portion of a semiconductor substrate and dielectric layer during one step of the invention.

Referring to FIGS. 1 and 2, corona charge is applied to the layer 12 with the corona gun 18 to strongly accumulate the substrate 14. In the case of an N-type substrate, positive corona charge is applied to establish, for example, an electric field across the layer 12 of $3\times10^{12}$ charges/cm$^2$.

Referring to FIGS. 1, 3, 4 and 5, the chuck 16 is then moved under the pattern source 24 which includes the grating 36. The grid-like light pattern from the pattern source 24 establishes a grid-like pattern of positive charge areas (from the last step) and neutral (or at least substantially less positive, e.g., oxide potential down to 1 volt from 4 volts after 5 minutes) charge areas (from this step) on the layer 12. For example, ultraviolet light (wavelength=2,537 Angstroms, corresponding to about 4.9 eV) excites electrons over the 4.2 eV energy barrier between the valence band of the silicon and the conduction band of the oxide. Once in the oxide, the electrons move up toward the positive corona charges above them on the layer 12 and cancel them out leaving an area of much reduced corona charge as indicated by the areas 44 illustrated in FIG. 5. The areas 44 are shown as rectangular for ease of understanding, the example grating of FIG. 3 actually produces circular areas (the areas 44 correspond to the holes 42).

Referring to FIGS. 1 and 6, the chuck 16 is then moved under the corona gun 18 and corona charges of the opposite polarity applied until the areas 44 have enough negative corona charges to invert the substrate 14 thereunder.

This step also applies negative corona charges to the areas of the layer 12 bearing positive charges, but the initial amount of positive charge applied and the amount of negative charge applied are chosen such that only a portion of the positive corona charges is cancelled by the negative corona charges in these areas.

Referring to FIG. 6, the regions of positive and negative corona charge on the layer 12 result in corresponding field-induced PN junctions in the substrate 14. The P areas 46 are surrounded by N areas. To help insure initially good quality junctions, the humidity controller 22 maintains a relatively low relative humidity up to this point (e.g., less than ten percent, and, preferably, less than one percent).

Referring to FIGS. 1 and 7, the chuck 16 is moved under the SPV tool 26 and the SPV resulting from the field-induced PN junctions measured over time to provide a surface photovoltage characteristic. The surface photovoltage characteristic is the result of, for example, 200 field-induced PN junctions under the electrode 40. As time passes, the mobile charges from the layer 12 cause the corona charges on the layer 12 to redistribute and degrade the PN junctions. Eventually, the surface of the layer 12 will have a uniformly distributed charge corresponding to the initial corona charge polarity and no field-induced PN junctions will exist (and no SPV). To provide a reasonable length measurement period, as well as to provide a measurement closely linked to the mobile charge concentration in the layer 12, the humidity controller 22 is used to raise the relative humidity about the layer 12 prior to the measurement of the surface photovoltage characteristic. For example, a value of relative humidity greater than ten percent is desirable and a value between 30 and 35 percent is preferred.

Preferably, the relative humidity is kept constant during the measurement of the surface photovoltage characteristic because the rate at which the corona charges redistribute is strongly related to the relative humidity. For a relative humidity below one percent, almost no redistribution takes place. As the relative humidity increases, monolayers of water form on the surface of the dielectric layer 12. This layer of water acts as a polar solvent which causes the mobile charges (e.g., sodium ions) that have moved to the surface of the dielectric to enter solution. This forms a conductive electrolyte that allows the corona charge to redistribute. With the humidity held constant, or otherwise accounted for, the decay of the surface photovoltage characteristic is directly related to the mobile charge of the layer 12.

The foregoing uses the example of an N-type substrate. In the case of a P-type substrate, the polarities are simply reversed.

Comparison of the surface photovoltage characteristic of different wafers can provide a quick and accurate measure of the mobile charge concentration in the respective wafers. Because the method utilizes movement along the surface of the dielectric layer, rather than up and down, it is particularly useful in measuring mobile charge in thin oxides, which are becoming thinner and more common all of the time. The method also has the advantage of being a room temperature measurement.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A method for measuring mobile charge in a dielectric layer on a semiconductor substrate, said method comprising:

applying a first polarity corona charge to said layer;

illuminating said layer in a grid-like pattern with light;

applying a second polarity corona charge to said layer; and measuring a surface photovoltage characteristic for said layer, said characteristic being indicative of said mobile charge.

2. A method according to 1, further including providing a relative humidity of below 10 percent during said applying steps and said illuminating step.

3. A method according to 1, further including providing a relative humidity of above 10 percent during said measuring step.

4. A method according to 1, wherein said light is in the ultraviolet range.

5. A method for measuring mobile charge in an insulator layer on a semiconductor wafer, said method comprising:

placing said wafer on a vacuum chuck;

depositing corona charge of a first polarity on said layer with a corona gun;

illuminating said layer with ultraviolet light transmitted through a grid-like mask;

depositing corona charge of a second polarity on said layer with said corona gun;

measuring a surface photovoltage characteristic for said layer, said characteristic being indicative of said mobile charge.

6. A method according to 5, further including providing a relative humidity of below 10 percent during said depositing steps and said illuminating step.

7. A method according to 5, further including providing a relative humidity of above 10 percent during said measuring step.

* * * * *